(12) United States Patent
Kang et al.

(10) Patent No.: US 12,213,335 B2
(45) Date of Patent: Jan. 28, 2025

(54) DISPLAY DEVICE WITH IMPROVED ENCAPSULATION EFFICIENCY OF PAD PORTION

(71) Applicant: LG Display Co., Ltd., Seoul (KR)

(72) Inventors: Minjoo Kang, Seoul (KR); Joohwan Shin, Goyang-si (KR); Jin-Hoo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 482 days.

(21) Appl. No.: 17/539,637

(22) Filed: Dec. 1, 2021

(65) Prior Publication Data

US 2022/0173355 A1 Jun. 2, 2022

(30) Foreign Application Priority Data

Dec. 2, 2020 (KR) .................. 10-2020-0166954

(51) Int. Cl.
*H10K 59/127* (2023.01)
*H10K 50/84* (2023.01)
*H10K 50/842* (2023.01)
*H10K 59/131* (2023.01)
*H10K 77/10* (2023.01)

(52) U.S. Cl.
CPC ....... *H10K 50/8426* (2023.02); *H10K 59/131* (2023.02); *H10K 77/10* (2023.02)

(58) Field of Classification Search
CPC ............. H10K 59/131; H10K 50/8426; H10K 59/8722; H10K 77/10; H10K 59/127; H10K 59/8723; H10K 59/873
USPC ..... 257/72; 438/48, 128, 149, 151, 157, 283
See application file for complete search history.

(56) References Cited

U.S. PATENT DOCUMENTS

| 8,748,931 | B2 | 6/2014 | Choi et al. |
| 9,340,711 | B2 | 5/2016 | Ono et al. |
| 11,377,518 | B2 | 7/2022 | Kim et al. |
| 2003/0054146 | A1* | 3/2003 | Kim ................ C08L 63/00 428/209 |
| 2010/0012966 | A1 | 1/2010 | Choi et al. |

(Continued)

FOREIGN PATENT DOCUMENTS

| KR | 10-2010-0009057 A | 1/2010 |
| KR | 10-2014-0121235 A | 10/2014 |

(Continued)

OTHER PUBLICATIONS

Korean Intellectual Property Office, Office Action, Korean Patent Application No. 10-2020-0166954, Apr. 26, 2024, 16 pages.

(Continued)

*Primary Examiner* — Didarul A Mazumder
(74) *Attorney, Agent, or Firm* — Fenwick & West LLP

(57) ABSTRACT

A display device includes a first substrate having a thin-film transistor; a second substrate spaced apart from the first substrate; a dam disposed between the first substrate and the second substrate and disposed on an edge area of the first substrate; and a gap-maintaining film disposed between the first substrate and the second substrate and disposed on a central area of the first substrate surrounded with the edge area, wherein the dam contains an UV curable resin and a curing retarder. Thus, a sufficient time duration required for a bonding process after UV irradiation for curing the dam is secured.

18 Claims, 8 Drawing Sheets

(56) References Cited

U.S. PATENT DOCUMENTS

| | | | |
|---|---|---|---|
| 2010/0045181 A1* | 2/2010 | Oh | H10K 59/8722 |
| | | | 445/25 |
| 2013/0128207 A1* | 5/2013 | Nakano | G02F 1/13394 |
| | | | 349/141 |
| 2014/0061624 A1* | 3/2014 | Nagata | H01L 33/48 |
| | | | 257/40 |
| 2014/0132487 A1* | 5/2014 | Park | H10K 59/88 |
| | | | 345/55 |
| 2015/0218427 A1 | 8/2015 | Ono et al. | |
| 2019/0225740 A1 | 7/2019 | Kim et al. | |

FOREIGN PATENT DOCUMENTS

| | | |
|---|---|---|
| KR | 10-2016-0006657 A | 1/2016 |
| KR | 10-2018-0036619 A | 4/2018 |
| KR | 10-2018-0077652 A | 7/2018 |
| KR | 10-2020-0070811 A | 6/2020 |

OTHER PUBLICATIONS

Korean Intellectual Property Office, Office Action, Korean Patent Application No. 10-2020-0166954, Jul. 29, 2024, 16 pages.

\* cited by examiner (a)

(b)

DISPLAY DEVICE WITH IMPROVED ENCAPSULATION EFFICIENCY OF PAD PORTION

CROSS-REFERENCE TO RELATED APPLICATION

This application claims a benefit under 35 U.S.C. § 119(a) of Korean Patent Application No. 10-2020-0166954 filed on Dec. 2, 2020, in the Korean Intellectual Property Office, the entirety of disclosure of which is incorporated herein by reference for all purposes.

BACKGROUND

Field

The present disclosure relates to a display device. More specifically, the present disclosure relates to a display device including a curing-retarded dam.

Description of Related Art

A display device presents an image. Recently, with the development of display technology, flat panel display devices have been widely used. The flat panel display devices include liquid crystal display devices, organic electroluminescent display device, and micro LED display devices.

The organic electroluminescent display device is self-luminous, and thus does not require a separate light source, and is relatively superior to the liquid crystal display device in terms of brightness and a contrast ratio. In addition, the organic electroluminescent display device has an advantage in terms of a manufacturing process compared to the micro LED display device in that the former does not require a highly precise transfer process.

In the organic electroluminescent display device, layers made of an organic compound such as a hole injection layer, a hole transport layer, a light-emissive layer, an electron transport layer, and an electron injection layer are disposed between two electrodes acting as an anode and a cathode, respectively.

An organic compound may easily deteriorate due to moisture. For this reason, it is necessary to prevent the moisture from invading the layers made of the organic compound. To this end, typically, a panel of a display device is covered with an encapsulation material.

In recent years, a lot of research has been conducted on a metal based encapsulation material. Especially, a scheme of integrating the metal based encapsulation material and a rear cover with each other to obtain a simplified structure acting as an encapsulation member, a supporting member, and a heat dissipation member is emerging.

However, when the metal based encapsulation material is applied, ultraviolet rays do not pass through the metal based encapsulation material. Thus, it is difficult to bond a thin-film transistor substrate and the metal based encapsulation material with each other in an UV-curing manner.

SUMMARY

A purpose to be achieved by the present disclosure is to provide a display device including a dam. In particular, a purpose to be achieved by the present disclosure is to provide a display device in which a bonding process is available after UV irradiation for curing a dam.

Further, a purpose to be achieved by the present disclosure is to provide a display device that may improve an encapsulation efficiency of a pad portion.

Purposes in accordance with the present disclosure are not limited to the above-mentioned purpose. Other purposes and advantages in accordance with the present disclosure as not mentioned above may be understood from following descriptions and more clearly understood from embodiments in accordance with the present disclosure. Further, it will be readily appreciated that the purposes and advantages in accordance with the present disclosure may be realized by features and combinations thereof as disclosed in the claims.

A first aspect of the present disclosure provides a display device comprising: a first substrate having a thin-film transistor; a second substrate spaced apart from the first substrate; a dam disposed between the first substrate and the second substrate and on an edge area of the first substrate and/or the second substrate; and a gap-maintaining film disposed between the first substrate and the second substrate and on a central area surrounded with the edge area. In particular, the dam contains an UV curable resin and a curing retarder.

According to the present disclosure, the curing retarder is contained in the dam. Thus, a sufficient time duration required for a bonding process after UV irradiation for curing the dam may be secured.

In one embodiment of the first aspect, the second substrate is made of a metal material, and light is emitted from the device in a direction from the second substrate to the first substrate. That is, the display device according to the present disclosure may be of a bottom emission type. In the display device according to the present disclosure, the second substrate made of the metal material may serve as an encapsulation substrate. When the second substrate is made of the metal material, the UV curing may not be reliably conducted after bonding the first substrate and the second substrate to each other. However, according to the present disclosure, the curing may be retarded and thus the bonding process may be performed for a predefined time after the UV irradiation.

In one embodiment of the first aspect, each of the second substrate and the gap-maintaining film is made of a transparent material, and light is emitted from the device in a direction from the first substrate to the second substrate. That is, the display device according to the present disclosure may be of a top emission type. In this case, since light transmits through the second substrate, it is preferable that the second substrate and the gap-maintaining film are transparent.

In one embodiment of the first aspect, the UV curable resin includes an epoxy resin.

In one embodiment of the first aspect, the curing retarder includes at least one selected from a group consisting of isophthalic acid, tetraphthalic acid, salicylic acid, oxalic acid, lactic acid, tartaric acid tartaric acid, and gluconic acid.

In one embodiment of the first aspect, the gap-maintaining film contains hydrogen blocking particles. When the hydrogen blocking particles are contained in the gap-maintaining film, hydrogen that may be produced in the first substrate or hydrogen gas that may be produced in the UV curing process may be absorbed by the particles.

A second aspect of the present disclosure provides a display device comprising: a first substrate having an array portion including a thin-film transistor, and a pad portion including at least one pad and adjacent to the array portion; a second substrate made of a metal material and bonded to the first substrate while the pad portion is exposed, wherein a driver is disposed on a top face of the second substrate; a connector for electrically connecting the pad and the driver to each other; a first dam disposed between the first substrate and the second substrate and on an edge area of the first substrate and/or the second substrate; and a gap-maintaining film disposed between the first substrate and the second substrate and on a central area surrounded with the edge area, wherein the first dam or the gap-maintaining film is disposed on an edge area of the array portion adjacent to the pad portion, and a second dam is disposed on the pad portion and covering a side face of the first dam or the gap-maintaining film adjacent to the pad portion.

In the display device in which the pad portion is exposed, the second dam may be disposed on the pad portion and may cover the side face of the gap-maintaining film adjacent to the pad portion. Thus, the encapsulation effect by the dam may be improved due to the second dam.

In one embodiment of the second aspect, each of the first dam and the second dam contains an UV curable resin and a curing retarder. According to the present disclosure, the curing retarder is contained in each of the first and second dams. Thus, a sufficient time duration required for a bonding process after UV irradiation for curing the dam may be secured.

In one embodiment of the second aspect, a top of the second dam is higher than a top face of the gap-maintaining film. Thus, the encapsulation effect by dam may be improved due to the second dam.

In one embodiment of the second aspect, a metal layer or an inorganic compound layer is coated on at least a portion of a surface of the second dam. More effective encapsulation effect may be obtained due to the metal layer or the inorganic compound layer.

In one embodiment of the second aspect, the second dam is partially located between the first substrate and the second substrate, so that the second dam has a "L"-shaped structure.

In one embodiment of the second aspect, a following Equation 1 is satisfied:

$$A \geq B / \tan \theta, \quad \text{[Equation 1]}$$

wherein A denotes a length from a point where the connector is bent to a distal end of the second substrate adjacent to the pad portion, wherein B denotes a length from a top face of the first substrate to a top face of the second substrate, wherein θ denotes an angle between the connector and the top face of the first substrate at the point where the connector is bent.

Satisfying the Equation 1 may allow reducing or suppressing dent damage to the connector which the edge of the second substrate of the metal material may cause.

A third aspect of the present disclosure provides a display device comprising: a first substrate having an array portion including a thin-film transistor, and a pad portion including at least one pad and adjacent to the array portion; a second substrate made of a metal material and bonded to the first substrate while the pad portion is exposed, wherein a driver disposed on a top face of the second substrate; a connector for electrically connecting the pad and the driver to each other; a gap-maintaining film disposed between the first substrate and the second substrate; and a dam covering a side face of the gap-maintaining film.

In one embodiment of the third aspect, the dam is at least partially located between the first substrate and the second substrate, and the dam has a "L"-shaped structure.

In one embodiment of the third aspect, the dam contains an UV curable resin and a curing retarder.

In one embodiment of the third aspect, a top of the dam is higher than a top face of the gap-maintaining film.

In one embodiment of the third aspect, a metal layer or an inorganic compound layer is coated on at least a portion of a surface of the dam.

In one embodiment of the third aspect, a following Equation 1 is satisfied:

$$A \geq B / \tan \theta, \quad \text{[Equation 1]}$$

wherein A denotes a length from a point where the connector is bent to a distal end of the second substrate adjacent to the pad portion, wherein B denotes a length from a top face of the first substrate to a top face of the second substrate, wherein θ denotes an angle between the connector and the top face of the first substrate at the point where the connector is bent.

Details of other embodiments are included in the detailed description and drawings.

According to the display device according to the present disclosure, the curing retarder is contained in the dam, such that a sufficient time duration required for the bonding process after the UV irradiation for curing the dam may be secured. Therefore, even when the second substrate is in a form of a thick metal layer, a UV curable resin may be employed as a material of the dam.

Further, according to the display device according to the present disclosure, when hydrogen blocking particles are contained in the gap-maintaining film, hydrogen gas that may be produced from the first substrate or hydrogen gas that may be produced in the UV curing process may be absorbed by the particles. Thus, deterioration of organic compound based elements such as organic light emitting elements due to the hydrogen gas may be suppressed.

In addition to the effects as described above, specific effects in accordance with the present disclosure will be described together with the detailed description for carrying out the disclosure.

DETAILED DESCRIPTIONS

Figure 1:
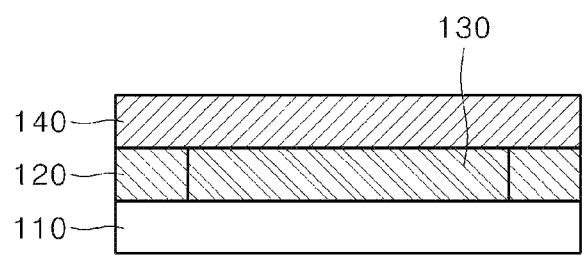
FIG. 1 schematically shows a display device according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, display devices according to some embodiments of the present disclosure will be described.

Herein, the display device may be embodied as an organic electroluminescent display device, such as an OLED display device. However, the present disclosure is not limited thereto. The display device may be embodied as other flat panel display devices such as a liquid crystal display device and a micro LED display device.

FIG. 1 schematically shows a display device according to an embodiment of the present disclosure.

Referring to FIG. 1, the illustrated display device includes a first substrate 110, a dam 120, a gap-maintaining film 130, and a second substrate 140.

The first substrate 110 refers to a substrate having a thin-film transistor. For example, the first substrate 110 refers to a substrate on which a thin-film transistor is disposed. In addition to the thin-film transistor, an organic light emitting diode or a micro LED may be disposed on the first substrate 110.

The second substrate 140 is spaced apart from the first substrate 110. The second substrate 140 may have the same size as the first substrate 110. Alternatively, the second substrate 140 may have different size from the first substrate 110.

The dam 120 and the gap-maintaining film 130 are disposed between the first substrate 110 and the second substrate 140. The dam 120 may be disposed in an edge area of an entire area between the first substrate 110 and the second substrate 140. The gap-maintaining film 130 may be disposed in a central area other than the edge area of the entire area between the first substrate 110 and the second substrate 140. For example, the dam 120 may be disposed on an edge area of the first substrate 110 and/or the second substrate 140, and the gap-maintaining film 130 may be disposed on a central area surrounded with the edge area.

In accordance with the present disclosure, the dam 120 contains an UV curable resin and a curing retarder. The UV curable resin may include an epoxy resin. The curing retarder may be contained in an amount of about 0.1 to 5 parts by weight based on 100 parts by weight of a raw material for the UV curable resin, for example, an epoxy acrylate. When the content of the curing retarder is too low, it may be difficult to obtain a sufficient curing retardation effect. Further, when the content of the curing retarder is too high, a curing reaction itself may not be properly performed.

The curing retarder retards a UV curing process of a dam composition. In this connection, the dam composition refers to a composition for producing a dam made of an UV curable resin material. The dam composition may contain, for example, an epoxy acrylate, a crosslinking agent, a photo-initiator, the curing retarder, a filler, and the like. The dam composition may further contain various known components at various contents without limitation.

For example, when applying the dam composition to produce the UV curable resin on and along the edge area of the first substrate 110 and curing the composition via irradiation of UV, the curing retarder retards a photopolymerization reaction, such that the first and second substrates may be bonded to each other during the UV based curing process. For example, when the curing retarder is not added to the dam composition, curing may be completed within tens of seconds under UV irradiation. On the contrary, when the curing retarder is added to the dam composition, curing is retarded such that the completion timing of the curing is about 1200 seconds after UV irradiation. That is, according to the present disclosure, the curing retarder is contained in the dam, such that a sufficient time duration required for the bonding process after UV irradiation for curing the dam, for example, a time duration of about 600 seconds to 1200 seconds for the bonding process may be secured.

The curing retarder that may be applied to the dam of the display device according to the present disclosure may be organic acid. More specifically, the organic acid may include, for example, isophthalic acid, tetraphthalic acid, salicylic acid, oxalic acid or lactic acid, tartaric acid, and gluconic acid. The curing retarder may contain a single type of an organic acid. In another example, the curing retarder may contain two or more types of organic acids.

The gap-maintaining film 130 acts to maintain a gap between the first substrate 110 and the second substrate 140. The gap-maintaining film 130 may be composed of a film made of a variety of known materials such as an acrylic film, an olefin film, and an epoxy film. Further, the gap-maintaining film 130 may have a single-layer structure composed of one film, or may have a stacked structure of two or more films.

Preferably, a thickness of the gap-maintaining film 130 may be substantially the same as a vertical dimension of the dam 120.

In one example, the gap-maintaining film 130 may contain hydrogen blocking particles. The hydrogen blocking particles may include known hydrogen blocking particles made of metal, metal oxide, zeolite, etc. without limitation. When hydrogen blocking particles are contained in the gap-maintaining film 130, the particles may absorb hydrogen gas that may be produced in the first substrate 110 or hydrogen gas that may be produced in the UV curing process, thereby suppressing air bubbles, and preventing deterioration of the organic material.

Figure 2:
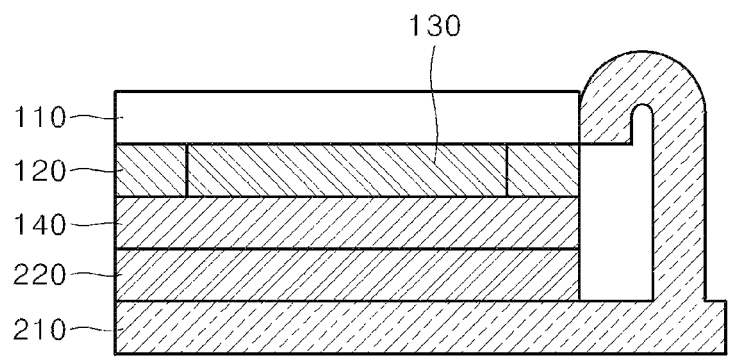
FIG. 2 shows an example in which the display device shown in FIG. 1 is attached to a back cover.

FIG. 2 shows an example in which the display device shown in FIG. 1 is attached to a back cover.

Referring to FIG. 2, the display device shown in FIG. 1 may be combined with a back cover 210. The back cover 210 may be made of a material such as plastic or metal. A circuit board (not shown) for driving the display device may be disposed between the back cover 210 and the second substrate 140. The back cover 210 may be attached to the second substrate 140 via an adhesive layer 220.

In one example, referring to FIG. 2, the back cover 210 may extend to a side face of the display device. That is, in FIG. 2, the back cover 210 may extend to a side face of the first substrate 110. Due to the configuration of the back cover 210, an outer portion of the display device may be protected from external impact.

Figure 3:
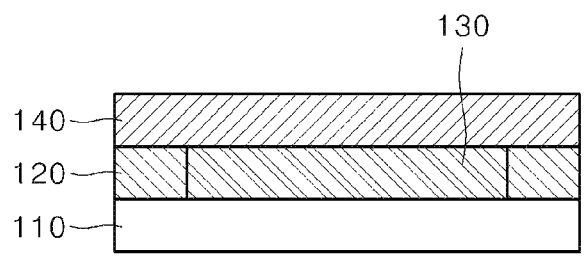
FIG. 3 shows an example in which the display device shown in FIG. 1 is of a bottom emission type in part (a) and is of a top emission type in part (b).
Figure 3:
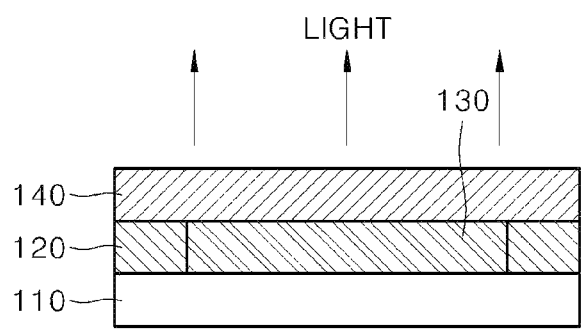

FIG. 3 shows an example in which the display device shown in FIG. 1 is of a bottom emission type in part (a) and a top emission type in part (b).

The display device according to the present disclosure may emit light in a direction from the second substrate 140 toward the first substrate 110, as shown in part (a) in FIG. 3. That is, the display device according to the present disclosure may be of a bottom emission type.

In this case, the second substrate 140 may be made of a metal material. More specifically, the second substrate 140 may include aluminum, copper, iron, and the like. The second substrate 140 made of a metal material may include a single metal or an alloy, or may include a metal-carbon composite. The second substrate 140 made of the metal material may have a thickness of about 0.3 to about 1.0 mm.

The second substrate made of the metal material may serve as an encapsulation substrate, and may also serve as a heat dissipation member. When the second substrate 140 is made of a metal material, it is difficult to perform UV curing after the bonding of the first substrate 110 and the second substrate 140 in a conventional case. However, according to the present disclosure, the curing may be retarded so that the bonding process may proceed for a predefined time duration after the UV irradiation.

Further, in the display device according to the present disclosure, light may be emitted in a direction from the first substrate 110 toward the second substrate 140, as shown in part (b) in FIG. 3. That is, the display device according to the present disclosure may be of a top emission type.

In order to realize the top emission type structure, the second substrate 140 and the gap-maintaining film 130 should be made of a transparent material. In accordance with the present disclosure, the term "transparent" means a visible light transmittance of at least 70%.

Figure 4:
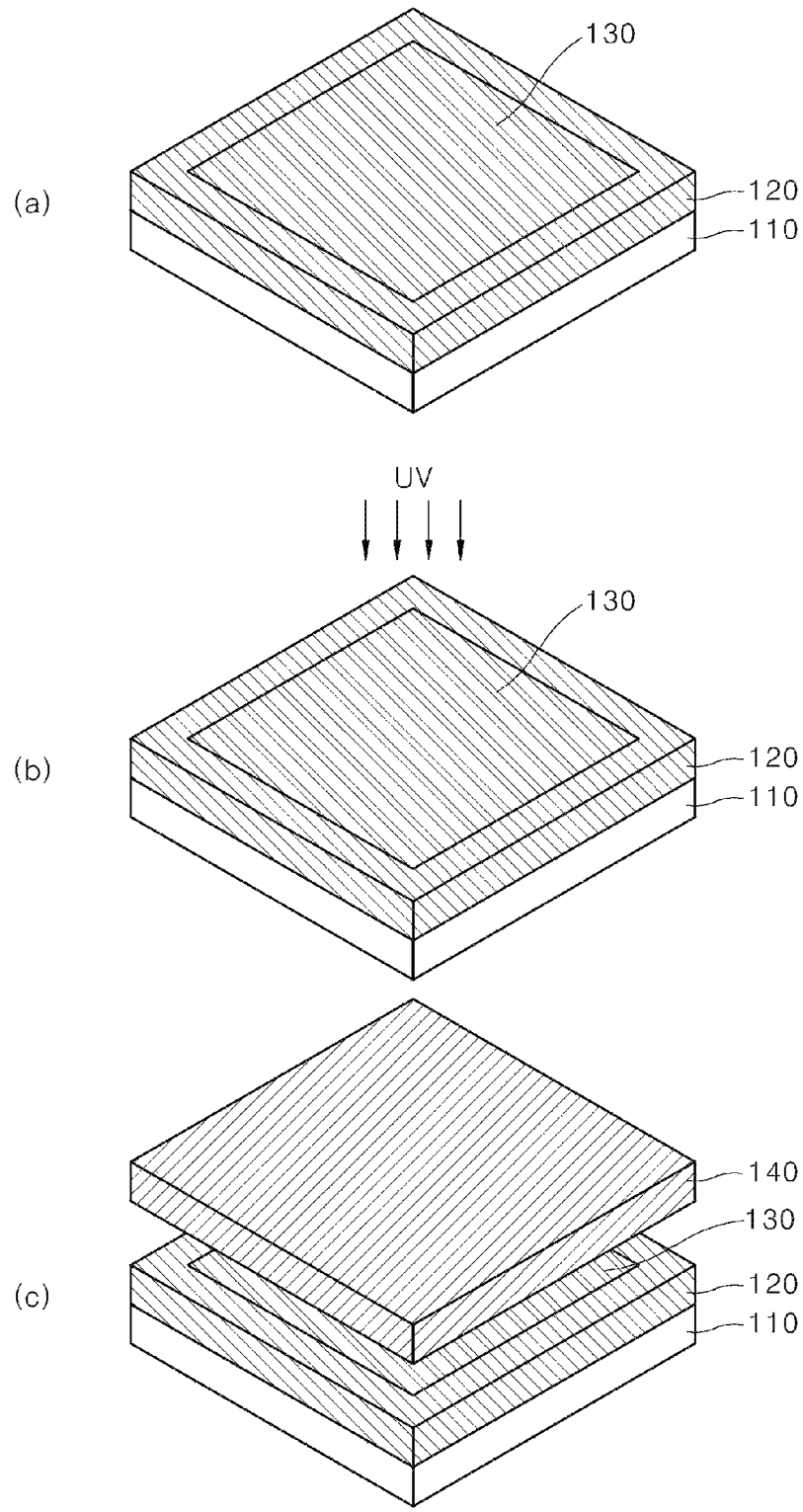
FIG. 4 schematically shows an example of a manufacturing method of a display device according to the present disclosure.

FIG. 4 schematically shows an example of a manufacturing method of a display device according to the present disclosure.

For convenience, a reference numeral 120 is assigned to the dam composition.

First, as shown in part (a) in FIG. 4, the dam composition 120 is applied to a top face of an edge area of the first substrate 110, and the gap-maintaining film 130 is disposed on a central area of the top face of the first substrate 110.

Thereafter, as in the example shown in part (b) in FIG. 4, UV is irradiated to cure the dam composition 120. In this connection, the dam composition 120 contains the curing retarder, so that the curing is retarded for about 600 to 1200 seconds.

Thereafter, as shown in part (c) in FIG. 4, the second substrate 140 is bonded to the first substrate 110 during the curing process of the dam composition 120.

Alternatively to FIG. 4, the dam composition 120 and the gap-maintaining film 130 may be placed on the second substrate 140, and then the first substrate 110 may be bonded thereto during the UV curing.

Figure 5:
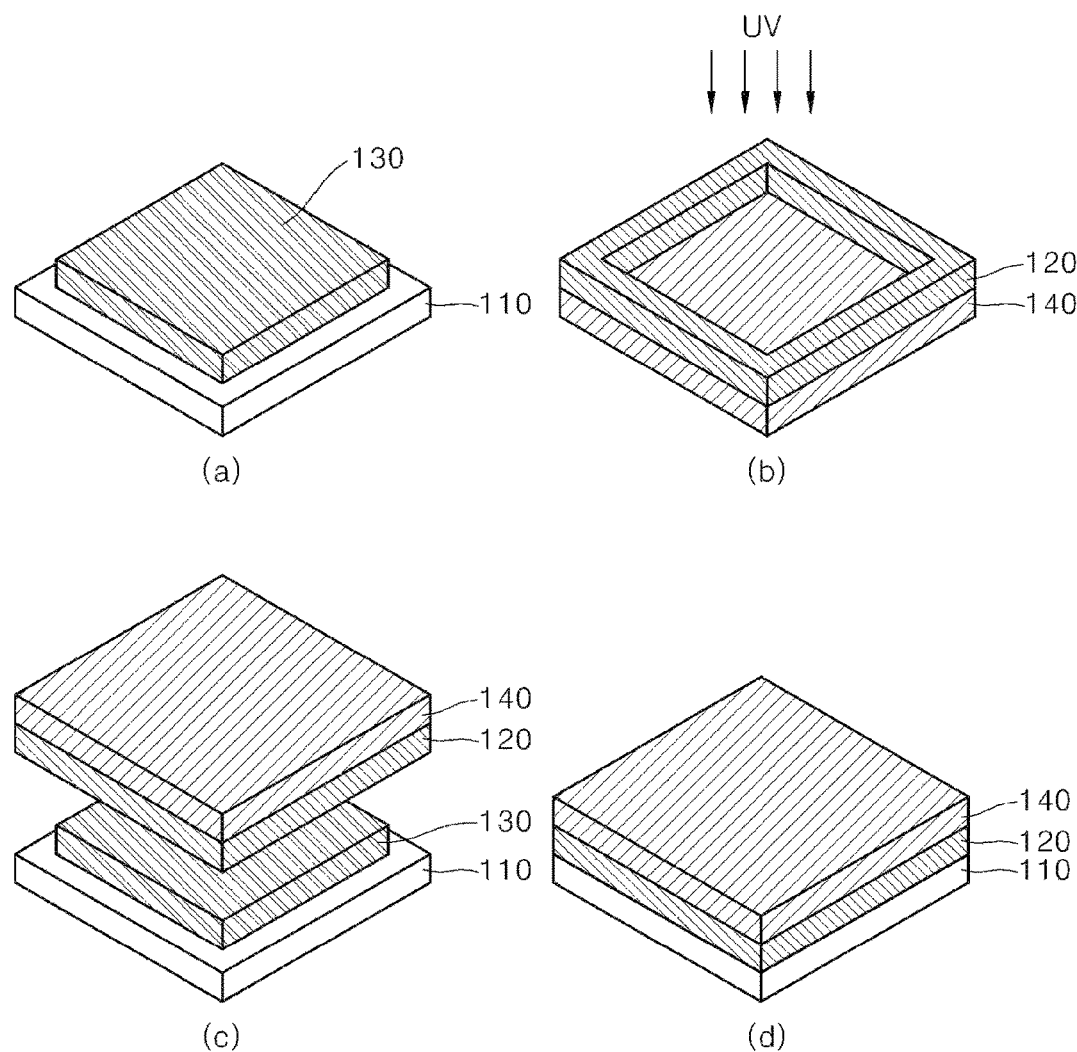
FIG. 5 schematically shows another example of a manufacturing method of a display device according to the present disclosure.

FIG. 5 schematically shows another example of a manufacturing method of a display device according to the present disclosure.

First, as shown in part (a) in FIG. 5, first, the gap-maintaining film 130 is placed on an central area of the first substrate 110. Moreover, as shown in part (b) in FIG. 5, the dam composition 120 is applied to an edge area of the second substrate 140. Then, UV irradiation is performed on the second substrate 140 on which the dam composition 120 is applied.

Thereafter, as shown in parts (c) and (d) in FIG. 5, the first substrate 110 and the second substrate 140 are bonded to each other during the curing process of the dam composition 120.

Alternatively to FIG. 5, the gap-maintaining film 130 is disposed on the second substrate 140, and the dam composition 120 is applied on the first substrate 110. The UV irradiation is performed. The second substrate 140 may be bonded to the first substrate 110 during the UV curing.

Figure 6:
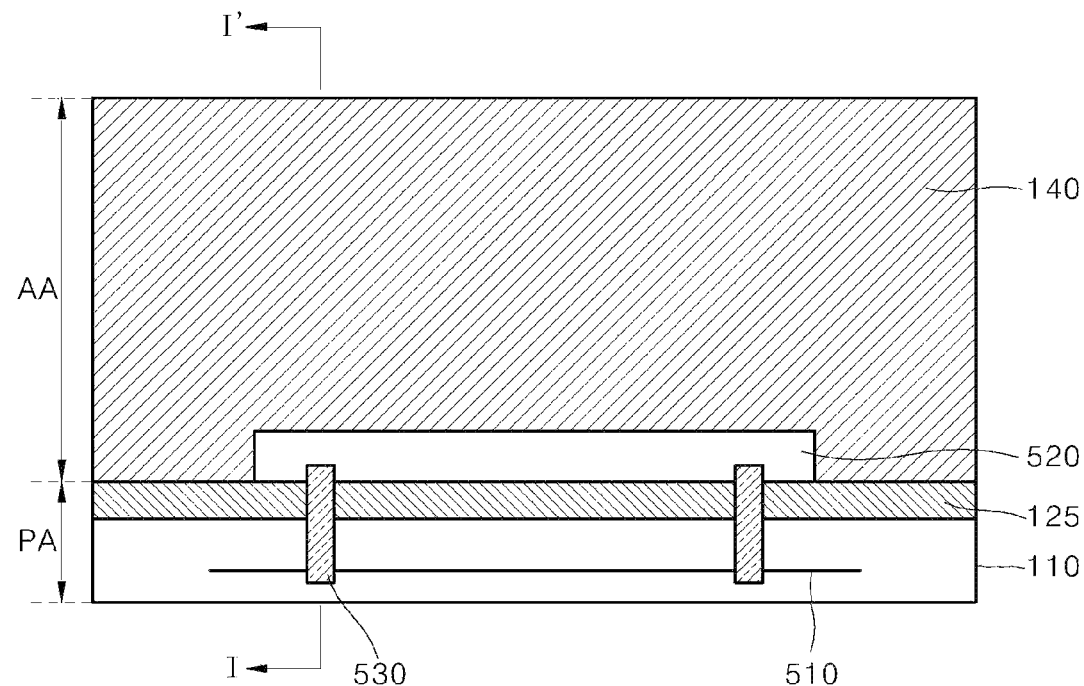
FIG. 6 schematically shows a back or rear face of a display device according to another embodiment of the present disclosure.
Figure 7:
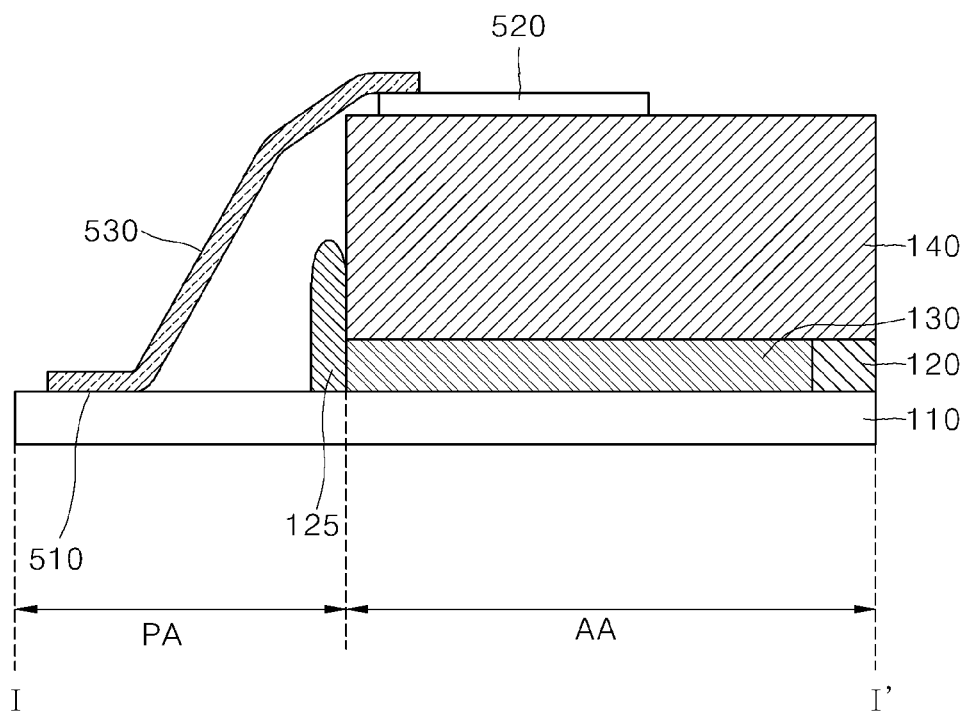
FIG. 7 shows an example of a I-I cross-sectional view of FIG. 6.

FIG. 6 schematically shows a back face of a display device according to another embodiment of the present disclosure. FIG. 7 shows an example of a I-I cross-sectional view of FIG. 6.

Referring to FIGS. 6 and 7, the illustrated display device has a similarity to the embodiment illustrated in FIG. 1 in that each of the former and the latter includes the first substrate 110 and the second substrate 140.

However, unlike the example related to FIG. 1, in the embodiments shown in FIGS. 6 and 7, at least one pad 510 is disposed on the first substrate 110 and is exposed. The second substrate 140 is displaced from this pad by a predefined distance.

The first substrate 110 has an array portion AA including a thin-film transistor, and has a pad portion PA on one side of the array portion AA and including the pad 510 electrically connected to the array portion. This embodiment relates to an example in which the pad portion is exposed upwardly, and only the array portion AA of the first substrate is bonded to the second substrate 140. A boundary between the pad portion PA and the array portion AA is defined as a distal end of the second substrate 140 adjacent to the pad portion.

The second substrate 140 is bonded to the first substrate 110 while exposing the pad 510 in the pad portion. Moreover, a driver 520 is disposed on a top face of the second substrate 140. The driver 520 may be configured for driving the display device, and may include an IC chip, a printed circuit board, and the like.

The pad 510 in the pad portion PA and the driver 520 are electrically connected to each other via a connector 530. The connector 530 may be, for example, in a form of a COF (Chip On Film).

In one example, referring to FIG. 7, a first dam 120 is disposed between the first substrate 110 and the second substrate 140. The first dam 120 may contain a UV curable resin and the curing retarder as described in FIG. 1. Since the curing retarder is contained in the first dam 120, a sufficient time duration required for the bonding process after the UV irradiation for curing the dam may be secured.

In one example, referring to FIG. 7, the first dam 120 is disposed in an edge area and between the first substrate 110 and the second substrate 140. Moreover, the gap-maintaining film 130 is disposed in a central area and between the first substrate 110 and the second substrate 140.

However, the first dam 120 or the gap-maintaining film 130 is disposed in an edge area of the array portion adjacent to the pad portion PA and between the first substrate 110 and the second substrate 140. In a plan view, the first dam 120 may has "C" shape or a "☐" shape. FIG. 7 shows an example in which the gap-maintaining film 130 is disposed in an edge area adjacent to the pad portion and between the first substrate 110 and the second substrate 140.

A second dam 125 covering a side face of the gap-maintaining film or the first dam disposed in the edge area adjacent to the pad portion and between the first substrate 110 and the second substrate 140 is disposed on the pad portion PA.

A top of the second dam 125 may be flush with a top face of the gap-maintaining film 130. However, it is preferable that the top of the second dam 125 is higher than the top face of the gap-maintaining film 130. FIG. 7 shows an example in which the top of the second dam 125 is located at a middle vertical level of the second substrate 140. As the top of the second dam 125 is higher than the top face of the gap-maintaining film 130, an effect of inhibiting invasion of moisture and air through a side face of the first substrate 110 may be improved.

The second dam 125 may be made of a UV curable resin such as an epoxy resin. In another example, the second dam 125 may be made of a thermally curable resin. In terms of a process, preferably, a dam composition for forming the second dam 125 may be the same as the dam composition for forming the first dam 120. In another example, because the second dam 125 is UV curable while being exposed, the second dam 125 may not contain the curing retarder.

Figure 8:
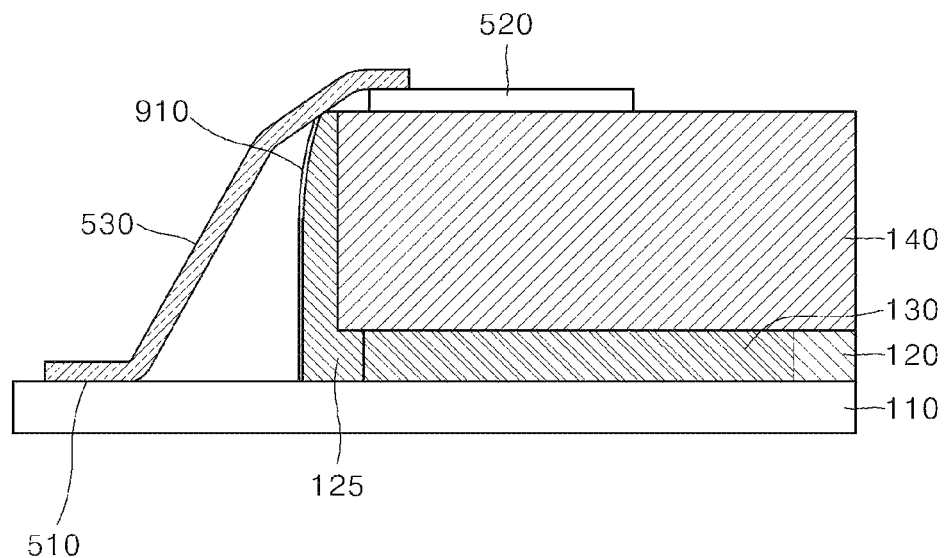
FIG. 8 schematically shows a cross section of a display device according to another embodiment of the present disclosure.

FIG. 8 schematically shows a cross section of a display device according to another embodiment of the present disclosure.

As shown in the example shown in FIG. 8, a top of the second dam 125 may be flush with a top face of the second substrate 140. When the top of the second dam 125 is flush with the top face of the second substrate 140, a connector 530 may not be in direct contact with a sharp edge of the top face of the second substrate 140. Since the second dam 125 is made of a polymer material, dent damage to the connector 530 may be reduced, compared to an edge of the second substrate 140 made of the metal material.

In one example, in FIG. 8, a metal layer or an inorganic compound layer 910 may be disposed on at least a portion of a surface of the second dam 125. The metal layer or the inorganic compound layer serves as an additional encapsulation layer. Thus, a more effective encapsulation effect may be obtained due to the metal layer or the inorganic compound layer 910, such that the invasion of moisture through the second dam 125 may be further reduced.

Further, referring to FIG. 8, a portion of the second dam 125 may be located between the first substrate 110 and the second substrate 140, so that the second dam may have an "L" shaped structure. In this case, the moisture invasion path becomes longer, such that high encapsulation effect may be obtained.

Figure 9:
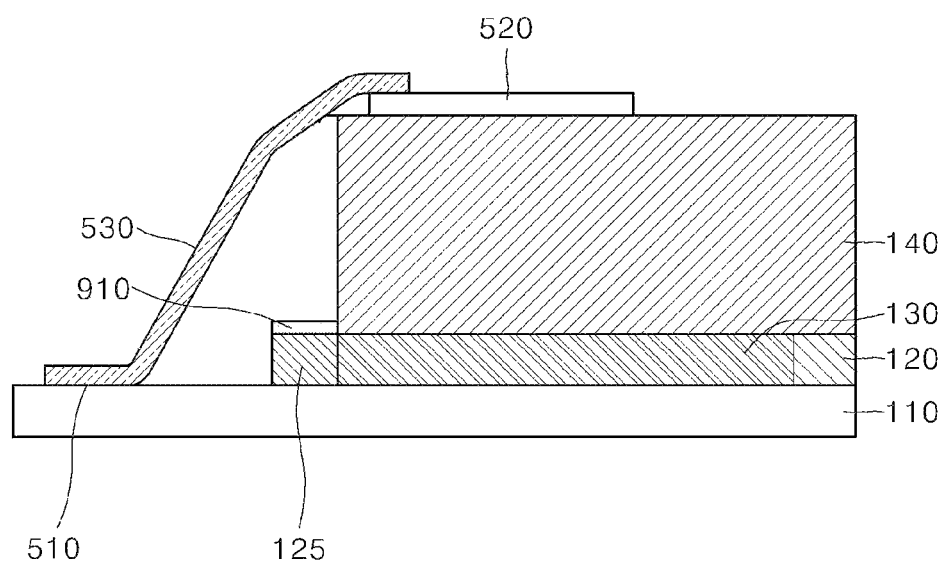
FIG. 9 schematically shows a cross section of a display device according to still another embodiment of the present disclosure.

FIG. 9 schematically shows a cross section of a display device according to still another embodiment of the present disclosure.

As shown in the example shown in FIG. 9, a top of the second dam 125 may be substantially flush with a top of the gap-maintaining film 130.

Further, as in the example shown in FIG. 9, a top of the second dam 125 may have a flat structure. In another example, as shown in FIGS. 7 and 8, the top of the second dam 125 may have a curved structure.

Moreover, as shown in FIG. 9, a metal layer or an inorganic compound layer 910 may be additionally disposed only on the top face of the second dam 125.

Figure 10:
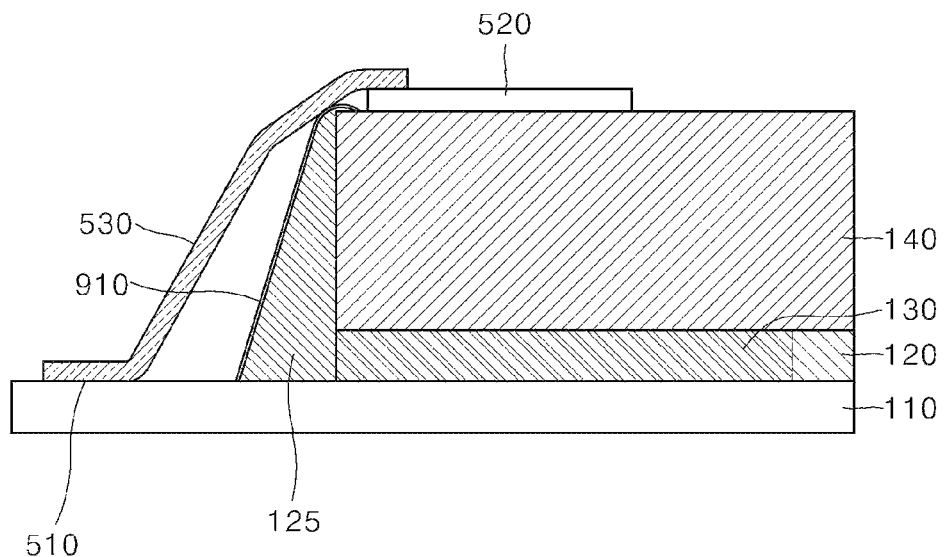
FIG. 10 schematically shows a cross section of a display device according to still yet another embodiment of the present disclosure.

FIG. 10 schematically shows a cross section of a display device according to still yet another embodiment of the present disclosure.

As shown in FIG. 10, the second dam 125 may have one side face in close contact with the gap-maintaining film 130 and the second substrate 140, and the opposite side face as an inclined face.

Further, as shown in the example shown in FIG. 10, a top of the second dam 125 may be slightly higher than a top of the second substrate 140, and a portion of the second dam 125 may contact a top face of the second substrate 140.

According to some embodiments, a display device according to the present disclosure satisfies a following Equation 1.

$$A \geq B/\tan(\theta) \qquad \text{[Equation 1]}$$

where A means a length from a point where the connector 530 is bent to a distal end of the second substrate 140 adjacent to the pad portion PA, and B denotes a length from a top face of the first substrate 110 to a top face of the second substrate 140. $\theta$ means an angle between the connector and a top face of the first substrate 110 at the point where connector 530 is bent.

Figure 11:
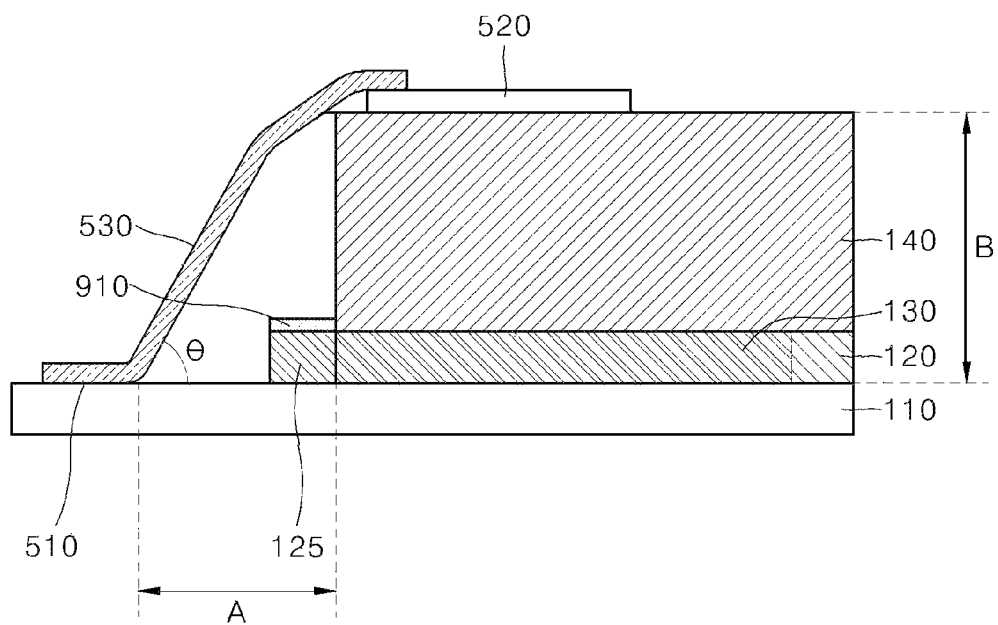
FIG. 11 shows variables of Equation 1.

FIG. 11 shows variables of Equation 1, that is, A, B, and $\theta$.

Table 1 shows a minimum A value based on B when $\theta$ is 11.3°.

TABLE 1

| B (mm) | $\theta$ (°) | A (mm) |
|---|---|---|
| 0.3 | 11.3° | 1.5 |
| 0.5 | | 2.5 |
| 1.0 | | 5.0 |

Satisfying Equation 1 means that the length A from the point where the connector 530 is bent to the distal end adjacent to the pad portion of the second substrate 140 is equal to a length of a base side of a right triangle defined by the angle $\theta$ and the vertical dimension B.

Satisfying Equation 1 may allow reducing or suppressing the dent damage to the connector which the edge of the second substrate of the metal material may cause.

Figure 12:
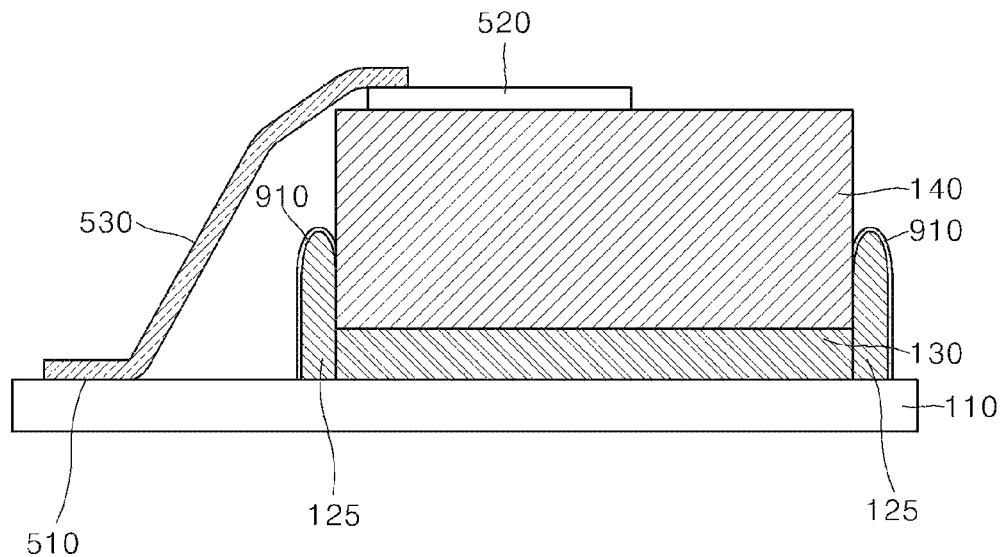
FIG. 12 schematically shows a cross section of a display device according to still yet further another embodiment of the present disclosure.

FIG. 12 schematically shows a cross section of a display device according to still yet further another embodiment of the present disclosure.

In the display device shown in FIG. 12, as in the example shown in FIG. 7, a top face of the first substrate 110 has an array portion including a thin-film transistor. A pad portion including the pad 510 that is electrically connected to the array portion is adjacent to the array portion. The second substrate 140 is bonded to the first substrate 110 while exposing the pad 510 in the pad portion. Moreover, a driver 520 is disposed on a top face of the second substrate 140. The pad 510 in the pad portion PA and the driver 520 are electrically connected to each other via a connector 530.

In one example, referring to FIG. 12, the gap-maintaining film 130 is disposed between the first substrate 110 and the second substrate 140. Moreover, both opposing side faces of the gap-maintaining film 130 may be respectively covered with both opposing dams 125. The dam 125 may contain the UV curable resin and the curing retarder. The dam 125 may contain the UV curable resins such as an epoxy resin and the curing retarder.

It is preferable that the top of the dam 125 is higher than the top face of the gap-maintaining film 130. FIG. 12 shows an example where the top of the dam 125 is located at a middle vertical level of the second substrate 140. Since the top of the dam 125 is higher than the top face of the gap-maintaining film 130, the invasion of moisture and air through both opposing side faces of the first substrate 110 may be suppressed, and the first substrate 110 and the second substrate 140 may be bonded to each other. Further, a metal layer or an inorganic compound layer 910 may be additionally disposed on at least a portion of a surface of the dam 125. In this case, the encapsulation effect against the moisture and air may be further improved.

In the embodiment shown in FIG. 12, the aforementioned Equation 1 may be satisfied.

Figure 13:
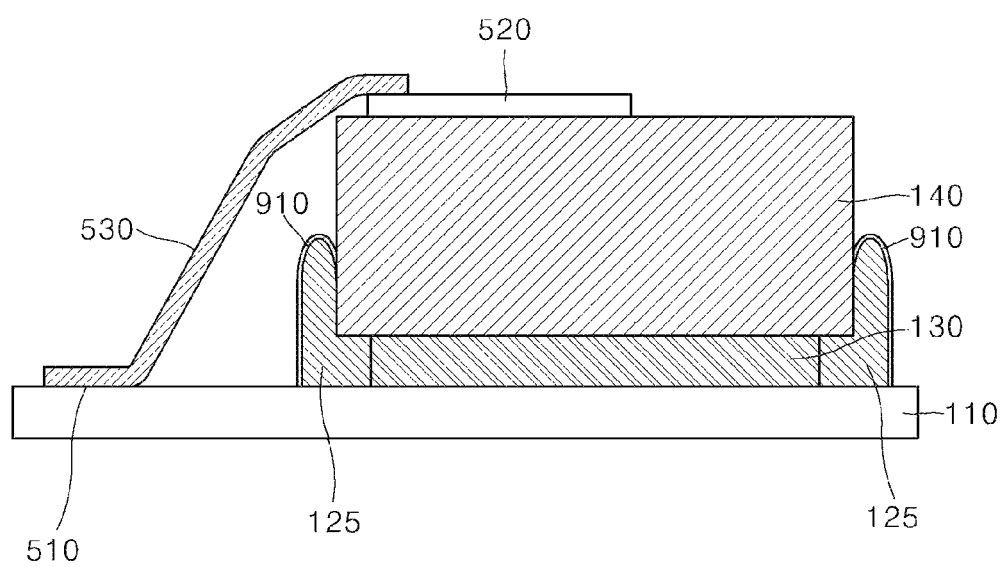
FIG. 13 schematically shows a cross section of a display device according to still yet further another embodiment of the present disclosure.

FIG. 13 schematically shows a cross section of a display device according to still yet further another embodiment of the present disclosure.

As shown in the embodiment shown in FIG. 13, the dam 125 is partially located between the first substrate 110 and the second substrate 140, and thus has a "L"-shaped cross-sectional structure. Both of the opposing dams 125 may have the "L"-shaped cross-sectional structure. In another example, one of the opposing dams 125 may have an "L"-shaped cross-sectional structure. When both or one of the opposing dams 125 has the "L"-shaped structure, the invasion path of moisture or air becomes longer, so that the encapsulation effect may be further increased.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
   a first substrate having a thin-film transistor, and a pad portion including at least one pad;
   a second substrate spaced apart from the first substrate, wherein a driver is disposed on a top face of the second substrate;
   a connector for electrically connecting the at least one pad and the driver to each other;
   a dam disposed between the first substrate and the second substrate and on an edge area of the first substrate and/or the second substrate; and
   a gap-maintaining film disposed between the first substrate and the second substrate on a central area surrounded with the edge area,
   wherein the dam contains an UV curable resin and a curing retarder.

2. The display device of claim 1, wherein the second substrate is made of a metal material, and light is emitted from the display device in a first direction from the second substrate to the first substrate.

3. The display device of claim 1, wherein each of the second substrate and the gap-maintaining film is made of a transparent material, and light is emitted from the display device in a second direction from the first substrate to the second substrate.

4. The display device of claim 1, wherein the UV curable resin includes an epoxy resin.

5. The display device of claim 1, wherein the curing retarder includes at least one selected from a group consisting of isophthalic acid, tetraphthalic acid, salicylic acid, oxalic acid, lactic acid, tartaric acid tartaric acid, and gluconic acid.

6. The display device of claim 1, wherein the gap-maintaining film contains hydrogen blocking particles.

7. A display device comprising:
   a first substrate having an array portion including a thin-film transistor, and a pad portion including at least one pad and adjacent to the array portion;
   a second substrate made of a metal material and bonded to the first substrate while the pad portion is exposed, wherein a driver is disposed on a top face of the second substrate;
   a connector for electrically connecting the at least one pad and the driver to each other;
   a first dam disposed between the first substrate and the second substrate and on an edge area of the first substrate and/or the second substrate; and
   a gap-maintaining film is disposed between the first substrate and the second substrate and on a central area surrounded with the edge area,
   wherein the first dam or the gap-maintaining film is disposed on an edge area of the array portion adjacent to the pad portion, and a second dam is disposed on the at least one pad portion and covering a side face of the first dam or the gap-maintaining film adjacent to the at least one pad portion.

8. The display device of claim 7, wherein each of the first dam and the second dam contains an UV curable resin and a curing retarder.

9. The display device of claim 7, wherein a top of the second dam is higher than a top face of the gap-maintaining film.

10. The display device of claim 7, wherein a metal layer or an inorganic compound layer is coated on at least a portion of a surface of the second dam.

11. The display device of claim 7, wherein the second dam is partially located between the first substrate and the second substrate, so that the second dam has a "L"-shaped structure.

12. The display device of claim 7, wherein a following Equation 1 is satisfied:

$$A \geq B/\tan \theta, \qquad \text{[Equation 1]}$$

wherein A denotes a length from a point where the connector is bent to a distal end of the second substrate adjacent to the pad portion,
wherein B denotes a length from a top face of the first substrate to a top face of the second substrate,
wherein $\theta$ denotes an angle between the connector and the top face of the first substrate at the point where the connector is bent.

13. A display device comprising:
   a first substrate having an array portion including a thin-film transistor, and a pad portion including at least one pad adjacent to the array portion;
   a second substrate made of a metal material bonded to the first substrate while the pad portion is exposed, wherein a driver disposed on a top face of the second substrate;
   a connector for electrically connecting the pad and the driver to each other;
   a gap-maintaining film disposed between the first substrate and the second substrate; and
   a dam covering a side face of the gap-maintaining film.

14. The display device of claim 13, wherein the dam is at least partially located between the first substrate and the second substrate, and the dam has a "L"-shaped structure.

15. The display device of claim 13, wherein the dam contains an UV curable resin and a curing retarder.

16. The display device of claim 13, wherein a top of the dam is higher than a top face of the gap-maintaining film.

17. The display device of claim 13, wherein a metal layer or an inorganic compound layer is coated on at least a portion of a surface of the dam.

18. The display device of claim 13, wherein a following Equation 1 is satisfied:

$$A \geq B/\tan \theta, \qquad \text{[Equation 1]}$$

wherein A denotes a length from a point where the connector is bent to a distal end of the second substrate adjacent to the pad portion,
wherein B denotes a length from a top face of the first substrate to a top face of the second substrate,
wherein $\theta$ denotes an angle between the connector and the top face of the first substrate at the point where the connector is bent.

* * * * *